(12) United States Patent
Tran

(10) Patent No.: US 7,639,097 B2
(45) Date of Patent: Dec. 29, 2009

(54) CRYSTAL OSCILLATOR CIRCUIT HAVING FAST START-UP AND METHOD THEREFOR

(75) Inventor: Daniel N. Tran, Boynton Beach, FL (US)

(73) Assignee: Freescale Semiconductor, Inc., Austin, TX (US)

( * ) Notice: Subject to any disclaimer, the term of this patent is extended or adjusted under 35 U.S.C. 154(b) by 98 days.

(21) Appl. No.: 11/870,733

(22) Filed: Oct. 11, 2007

(65) Prior Publication Data

US 2009/0096541 A1 Apr. 16, 2009

(51) Int. Cl.
*H03B 5/32* (2006.01)

(52) U.S. Cl. ............... 331/158; 331/34; 331/36 R; 331/36 C; 331/74; 331/109; 331/185; 331/186

(58) Field of Classification Search ............ 331/74, 331/109, 34, 36 R, 36 C, 158, 185, 186
See application file for complete search history.

(56) References Cited

U.S. PATENT DOCUMENTS

| | | | | |
|---|---|---|---|---|
| 5,844,448 | A * | 12/1998 | Jackoski et al. | 331/158 |
| 6,281,761 | B1 * | 8/2001 | Shin et al. | 331/116 FE |
| 6,377,130 | B1 * | 4/2002 | Haman | 331/176 |
| 6,747,522 | B2 * | 6/2004 | Pietruszynski et al. | 331/177 R |
| 6,759,914 | B2 | 7/2004 | Rusznyak | |
| 6,798,301 | B1 * | 9/2004 | Balan et al. | 331/74 |
| 6,819,195 | B1 | 11/2004 | Blanchard et al. | |
| 7,109,810 | B2 * | 9/2006 | Senthilkumar et al. | 331/116 R |
| 7,123,113 | B1 * | 10/2006 | Brennan et al. | 331/158 |
| 7,292,114 | B2 * | 11/2007 | Greenberg | 331/158 |
| 7,348,861 | B1 * | 3/2008 | Wu et al. | 331/158 |
| 7,369,009 | B2 * | 5/2008 | Hofer | 331/183 |
| 2006/0208817 | A1 * | 9/2006 | Satoh | 331/158 |
| 2007/0096841 | A1 | 5/2007 | Connell et al. | |
| 2008/0136486 | A1 * | 6/2008 | Lee | 327/291 |

OTHER PUBLICATIONS

Vittoz et al; "High-Performance Crystal Oscillator Circuits: Theory and Application"; IEEE Journal of Solid-State Circuits, vol. 23, No. 3, Jun. 1988.

* cited by examiner

*Primary Examiner*—Arnold Kinkead
*Assistant Examiner*—Richard Tan
(74) *Attorney, Agent, or Firm*—Daniel D. Hill; Kim-Marie Vo

(57) ABSTRACT

In one embodiment, a method of programming an oscillator circuit includes providing a resonator, a first programmable capacitor, a second programmable capacitor, and an amplifier. The first programmable capacitor and the second programmable capacitor may be programmed at a first capacitance value during a first time period, wherein the first programmable capacitor provides a first voltage to bias the resonator and the amplifier alters the second voltage to provide a third voltage to the resonator. During a second time period the first capacitance value is increased.

19 Claims, 3 Drawing Sheets

CRYSTAL OSCILLATOR CIRCUIT HAVING FAST START-UP AND METHOD THEREFOR

BACKGROUND

1. Field

This disclosure relates generally to oscillator circuits, and more specifically, to a crystal oscillator circuit having fast start-up and method therefor.

2. Related Art

One type of crystal oscillator circuit, commonly known as a Pierce oscillator, is frequently used to generate clock signals in integrated circuits. This type of oscillator circuit is formed by connecting a resonator (quartz crystal) between the input and output of an inverting amplifier with one capacitor connected between ground and the input of the inverting amplifier and a second capacitor connected between ground and the output of the inverting amplifier. Usually, the inverting amplifier is formed on an integrated circuit with two pins for connecting the resonator and the two capacitors.

The crystal oscillator circuit is inherently stable so that it takes a significant amount of time and energy just to start oscillating. The rate of energy consummation is less after the circuit starts oscillating. In battery powered applications it is important for long battery life to consume as little energy as possible. Therefore, what is needed is an oscillator circuit that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
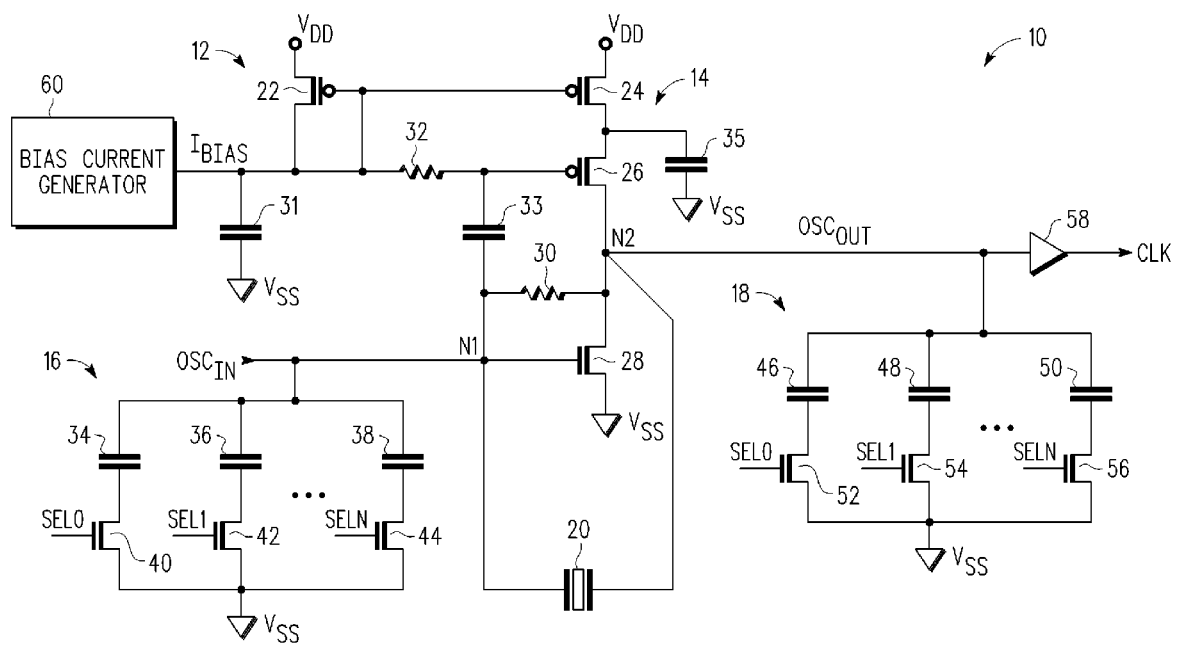
FIG. 1 illustrates, in partial block diagram form and partial schematic diagram form, a crystal oscillator circuit in accordance with an embodiment.

Generally, there is provided, an oscillator circuit that includes two programmable load capacitors and an amplifier that receives a programmable bias current. The two programmable load capacitors are implemented on an integrated circuit with the amplifier. In one embodiment, the amplifier is an inverter. During start-up of the integrated circuit, the capacitance values of the two programmable load capacitors are set to a lower value to reduce the critical transconductance for oscillation. Also, the bias current to the amplifier is increased. Together, the greater bias current and lower capacitance values reduce the time and energy it takes to start oscillation. After a predetermined time to allow oscillation to start, the capacitance values and bias current are set at the proper values for normal operation. Reducing start-up time functions to lower power consumption of the integrated circuit and thus increase battery life.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

In one aspect, there is provided a method of operating an oscillator circuit, the method comprises: providing a resonator, a first programmable load capacitor, a second programmable load capacitor, and an amplifier having an input and an output, wherein the first programmable load capacitor is coupled to the input, the second programmable load capacitor is coupled to the output, and the resonator is coupled between the input and the output; programming both the first and second programmable load capacitors to have a first capacitance value for a predetermined time period during startup of the oscillator circuit; and reprogramming the first and second programmable load capacitors to have a second capacitance value greater than the first capacitance value after the predetermined time period. The method further includes providing an amplifier comprising a transistor; and the transistor receives a bias current. The method further includes providing a bias current generator for providing the bias current to the transistor, wherein the bias current generator comprises a timer, a plurality of transmission gates, and a plurality of bias transistors, wherein: each of the plurality of transmission gates is coupled to one of the plurality of bias transistors, and the timer is coupled to one of the plurality of transmission gates; biasing each of the plurality of transmission gates with a first control voltage; and removing the first control voltage from the one of the plurality of transmission gates coupled to the timer when the timer sends a signal to the one of the plurality of transmission gates. The method includes providing a first plurality of switchable parallel capacitors; and providing a second plurality of switchable parallel capacitors. The method further comprises providing a first bias current to the amplifier during the predetermined time period, and providing a second bias current to the amplifier after the predetermined time period, wherein the first bias current is greater than the second bias current. The method further includes: providing a current mirror coupled to the bias current generator and the resonator, wherein the current mirror alters the bias current from the bias current generator before the bias current is received by the amplifier. The resonator further comprises a quartz crystal. Also, the transistor comprises an N-type metal oxide semiconductor (MOS) transistor having a gate coupled to a resistor and a drain coupled to the resistor.

In another aspect, there is provided, a method of operating a crystal oscillator circuit, the method comprising: providing a crystal, a first load capacitor, an amplifier, and a bias current generator, wherein the crystal is coupled to the first load capacitor and the amplifier, and wherein the bias current generator provides a bias current for the amplifier, the bias current generator comprises a first transmission gate coupled to a first transistor and a second transmission gate coupled to a second transistor; programming the first load capacitor to have a first capacitance value during a first time period, wherein the crystal receives a first signal from the first load capacitor; providing the first transmission gate with a first control voltage and providing the second transmission gate with a second control voltage during the first time period to generate the bias current; altering the bias current by changing the second control voltage to a third control voltage following the first time period to begin a second time period; and increasing the first load capacitance value during the second time period, wherein the crystal receives a second signal from the first load capacitor during the second time period. The method further includes lowering the second control voltage in response to changing the second control voltage to a third control voltage comprises. The method includes programming the first load capacitor to have a second capacitance value during the second time period, wherein the second capacitance value is greater than the first capacitance value. In one embodiment, the first capacitance value is approximately 3 picoFarads and the second capacitance value is approximately 19 picoFarads. The first load capacitor may comprise a providing a plurality of switchable parallel capacitors. The method further comprises providing a current mirror coupled to the bias current generator and the crystal, wherein the current mirror alters the bias current from the bias current generator before the bias current is received by the amplifier. In one embodiment, the amplifier has a first input terminal for receiving the bias current, a second input terminal coupled to a plate electrode of the first load capacitor, and an output terminal coupled to a plate electrode of a second load capacitor. The amplifier comprises an N-type metal oxide semiconductor (MOS) transistor having a gate coupled to a resistor and a drain coupled to the resistor. The method further includes: providing a second load capacitor coupled to the output terminal of the amplifier, wherein the second load capacitor comprises a plurality of switchable parallel capacitors; programming the second load capacitor at the first capacitance value during the first time period; and increasing the first load capacitance value during the second time period. The method includes programming the second load capacitor at a second capacitance value during the second time period, wherein the second capacitance value is greater than the first capacitance value. The method includes providing the first load capacitor as a first integrated load capacitor; and providing the second load capacitor further comprises providing a second integrated load capacitor.

In yet another aspect, there is provided, a method of operating an oscillator circuit, the method comprising: providing a resonator having a first terminal and a second terminal, a first programmable capacitor coupled to the first terminal, a second programmable capacitor coupled to the second terminal, an amplifier having an input coupled to the first terminal and an output coupled to the second terminal, and a bias current generator for providing a bias current for the amplifier, wherein the bias current generator comprises: a first transmission gate coupled to a first transistor; and a second transmission gate coupled to a second transistor; providing a power supply voltage to the oscillator; programming the first programmable capacitor to have a first capacitance value during a startup time period; programming the second programmable capacitor to have the first capacitance value during the startup time period; providing the first transmission gate with a first control voltage; providing the second transmission gate with a second control voltage, the first and second transistors for generating a bias current during the startup time period; altering the bias current by changing the second control voltage to a third control voltage after the startup time period to begin normal operation of the oscillator circuit, wherein the third control voltage is less than the second control voltage; and increasing the first and second capacitance values after the startup time period during the normal operation of the oscillator circuit.

FIG. 1 illustrates, in partial block diagram form and partial schematic diagram form, a crystal oscillator circuit 10 in accordance with an embodiment. Crystal oscillator circuit 10 includes a current mirror 12, inverting amplifier 14, a programmable load capacitor 16, a programmable load capacitor 18, a quartz crystal 20, resistors 32 and 30, capacitors 31, 33, and 35, buffer 58, and bias current generator 60. Current mirror 12 includes P-channel transistors 22 and 24. Inverting amplifier 14 includes P-channel transistor 26 and N-channel transistor 28. Programmable load capacitor 16 includes a plurality of parallel-connected capacitive elements including capacitive elements 34, 36, and 38 and N-channel transistors 40, 42, and 44. Programmable load capacitor 18 includes N-channel transistors 46, 48, and 50 and a plurality of parallel-connected capacitive elements 52, 54, and 56.

In current mirror 12, P-channel transistor 22 has a source (current electrode) coupled to a power supply voltage terminal labeled "$V_{DD}$", a gate (control electrode) and a drain (current electrode) coupled together. P-channel transistor 24 has a source coupled to $V_{DD}$, a gate coupled to the gate of transistor 22, and a drain. In amplifier 14, P-channel transistor 26 has a source coupled to the drain of transistor 24, a gate, and a drain coupled to an output terminal N2 for providing an output oscillation signal labeled "$OSC_{OUT}$." N-channel transistor 28 has a drain coupled to the drain of transistor 26, a gate coupled to an input terminal N1 for receiving an input oscillation signal labeled "$OSC_{IN}$", and source coupled to a second power supply voltage terminal labeled "$V_{SS}$". Resistor 30 has a first terminal coupled to the drain of transistor 28, and a second terminal coupled to the gate of transistor 28. Resistor 32 has a first terminal coupled to the gate and drain of transistor 22, and a second terminal coupled to the gate of transistor 26. Bias current generator 60 has an input for receiving a clock signal labeled "CLK", an input terminal for receiving an enable signal labeled "ENABLE", and an output terminal for providing a programmable bias current labeled "$I_{BIAS}$". Capacitor 31 has a first plate electrode coupled to the output terminal of bias current generator 60, and a second plate electrode coupled to $V_{SS}$. Capacitor 33 has a first plate electrode coupled to the gate of transistor 26, and a second plate electrode coupled to the gate of transistor 28. Capacitor 35 has a first plate electrode coupled to the drain of transistor 24, and a second plate electrode coupled to $V_{SS}$. Quartz crystal 20 has a first terminal coupled to the gate of transistor 28 at terminal N1, and a second terminal coupled to the drain of transistor 28 at terminal N2. In the illustrated embodiment, $V_{DD}$ is supplied with a positive power supply voltage and $V_{SS}$ is coupled to ground. In other embodiments, the power supply voltage may be different.

In programmable capacitor 16, capacitive elements 34, 36, and 38 each have a first plate electrode coupled to input terminal N1, and each have a second plate electrode coupled to a terminal of a corresponding switch element, where a switch element is one of transistors 40, 42, and 44 in the illustrated embodiment. Transistor 40 is coupled between capacitive element 34 and $V_{SS}$, transistor 42 is coupled between capacitive element 36 and $V_{SS}$, and transistor 44 is coupled between capacitive element 38 and $V_{SS}$. The gate of each of transistors 40, 42, and 44 receive one signal of a plurality of select signals. Transistor 40 receives a select signal labeled "SEL0". Transistor 42 receives a select signal labeled "SEL1". Transistor 44 receives a select signal labeled "SELN". The select signals may be, for example, a multi-bit select signal is a register file (not shown) or a non-volatile memory (not shown). The amount of capacitance provided by programmable capacitor 16 is controlled by how many of the switch elements are closed. Capacitive elements 34, 36, and 38 can each provide the same capacitance value or can be sized to contribute different capacitance values as desired. In one embodiment, the capacitance values are binary weighted. In the illustrated embodiment, the capacitance value is programmed to be approximately 3 picoFarads during startup and approximately 19 picoFarads during normal operation.

In programmable capacitor 18, capacitive elements 46, 48, and 50 each have a first plate electrode coupled to output terminal N2, and each have a second plate electrode coupled to a terminal of a corresponding switch element, where a switch element is one of transistors 46, 48, and 50 in the illustrated embodiment. Transistor 52 is coupled between capacitive element 46 and $V_{SS}$, transistor 54 is coupled between capacitive element 48 and $V_{SS}$, and transistor 56 is coupled between capacitive element 50 and $V_{SS}$. The gate of each of transistors 52, 54, and 56 receive one signal of the plurality of select signals. For example, the gate of transistor 52 receives select signal SEL0, the gate of transistor 54 receives select signal SEL1, and the gate of transistor 56 receives select signal SELN. The amount of capacitance provided by programmable load capacitors 16 and 18 is controlled by how many of the switch elements are closed. Increasing a voltage of one of the select signals causes a corresponding one of transistors 40, 42, 44, 52, 54, and 56 to be conductive, thus coupling one of capacitors 34, 36, 38, 46, 48, and 50 to $V_{SS}$. Likewise, decreasing a voltage of one of the select signals causing the corresponding transistor to become substantially non-conductive, thus decoupling the corresponding capacitor from $V_{SS}$. Capacitive elements 46, 48, and 50 can each provide the same capacitance or can be sized to contribute different capacitance values as desired. In one embodiment, the capacitance values are binary weighted. In the illustrated embodiment, programmable capacitors 16 and 18 receive the same select signals. However, in other embodiments, the programmable capacitors may receive different select signals in order to provide different capacitance values. Also, programmable capacitors 16 and 18 may be implemented differently in different embodiments. For example, in one embodiment, the capacitors may be implemented in a CMOS (complementary metal oxide semiconductor) process using conventional transistors coupled to provide capacitance, or in the metal layers of the CMOS device. In another embodiment, one or more programmable MIMS (metal-insulator-metal system) type capacitors can be used.

Figure 2:
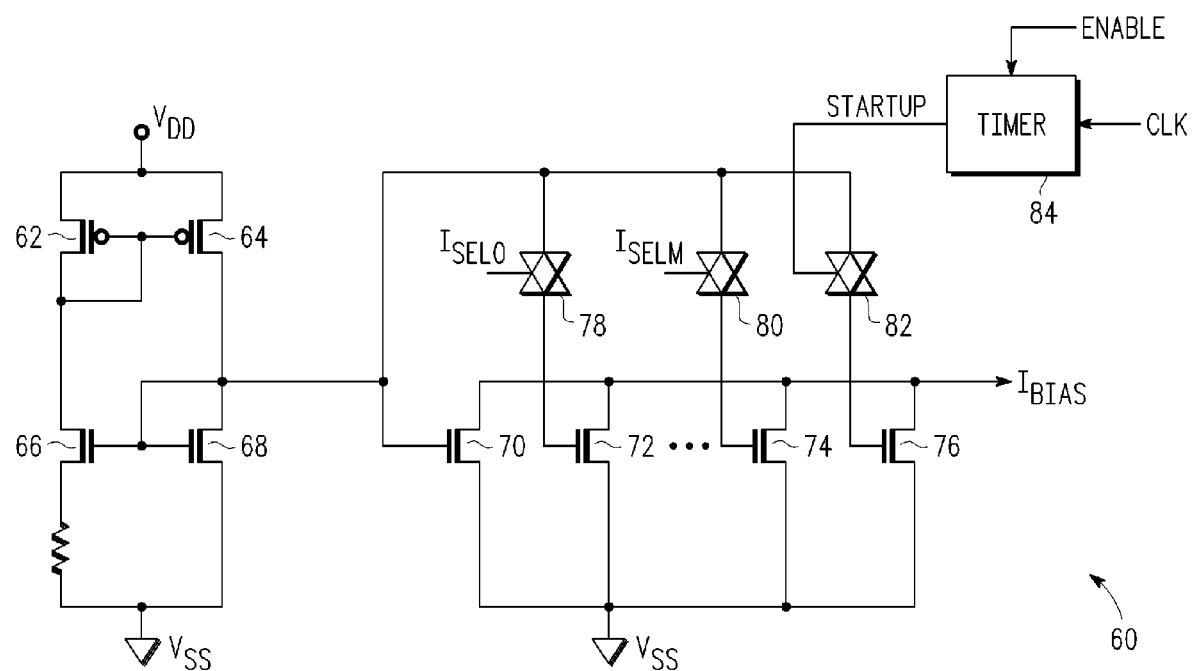
FIG. 2 illustrates, in partial block diagram form and partial schematic diagram form, one embodiment of the bias generator circuit of FIG. 1.

FIG. 2 illustrates, in partial block diagram form and partial schematic diagram form, one embodiment of the bias current generator circuit 60 of FIG. 1. Bias current generator 60 includes P-channel transistors 62 and 64, N-channel transistors 66, 68, 70, 72, 74, and 76, transmission gates 78, 80, and 82, and timer circuit 84. Transistors 66, 68, 70, 72, 74, and 76 form a current mirror circuit.

P-channel transistor 62 has a source coupled to $V_{DD}$, and a gate and drain coupled together. P-channel transistor 64 has a source coupled to $V_{DD}$, a gate coupled to the gate and drain of transistor 62, and a drain. N-channel transistor 66 has a drain coupled to the drain of transistor 62, a gate, and a source coupled to $V_{SS}$. N-channel transistor 68 has a gate and drain coupled to the drain of transistor 64, and a source coupled to $V_{SS}$. N-channel transistor 70 has a drain coupled to provide bias current $I_{BIAS}$, a gate coupled to the drain of transistor 68, and a source coupled to $V_{SS}$. N-channel transistor 72 has a drain coupled to the drain of transistor 70, a gate, and a source coupled to $V_{SS}$. N-channel transistor 74 has a drain coupled to the drain of transistor 70, a gate, and a source coupled to $V_{SS}$. N-channel transistor 76 has a drain coupled to the drain of transistor 70, a gate, and a source coupled to $V_{SS}$. Transmission gate 78 has a first terminal coupled to the gate and drain of transistor 68, a second terminal coupled to the gate of transistor 72, and a control terminal for receiving one of a plurality of current select signals labeled "$I_{SEL0}$". Transmission gate 80 has a first terminal coupled to the gate and drain of transistor 68, a second terminal coupled to the gate of transistor 74, and a control terminal for receiving a current select signal "$I_{SELM}$", where M is an integer. Transmission gate 82 has a first terminal coupled to the gate and drain of transistor 68, a second terminal coupled to the gate of transistor 76, and a control terminal for receiving a control signal labeled "STARTUP" from timer circuit 84. Timer circuit 84 has an input terminal for receiving an enable signal labeled "ENABLE", an input terminal for receiving a clock signal labeled "CLK", and an output terminal for providing the STARTUP signal. In one embodiment, timer circuit 84 is implemented using a counter.

The bias current $I_{BIAS}$ for normal operation is determined by which and how many of transistors 70, 72, and 74 are conductive. For example, if current select signal $I_{SEL0}$ and $I_{SELM}$ are asserted, then transmission gates 78 and 80 are conductive, causing transistors 72 and 74 to be biased into conduction. The drain-to-source currents of transistors 70, 72, and 74 will be added together to provide bias current $I_{BIAS}$. The amount of current is selectable for optimum operation and is programmable by the user by selecting which transistors to turn on. When powering up an integrated circuit having crystal oscillator circuit 10 the startup signal STARTUP is provided for a predetermined amount of time by timer 84 in response to the enable signal ENABLE. While startup signal STARTUP is being provided, transmission gate 82 is conductive to bias transistor 76 into conduction. A drain-to-source current of transistor 76 is added to the currents provided by other transistors of the current mirror, if any. In the illustrated embodiment, transistor 76 is sized relatively larger than transistors 70, 72, and 74 so that bias current $I_{BIAS}$ is then provided mostly by transistor 76. In other embodiments, the amount of current can be adjusted by transistor sizing and by making any combination of transistors conductive.

In a preferred embodiment, all of crystal oscillator 10 of FIG. 1 is implemented on a semiconductor integrated circuit, except for quartz crystal 20. In general, when power is first applied to the integrated circuit, or when a reset signal is asserted, load capacitors 16 and 18 are programmed to provide a minimum capacitance value and the bias current generator 60 is programmed to provide a relatively high bias current $I_{BIAS}$. After a certain time, both the load capacitance value and the bias current are set for normal operation. In the illustrated embodiment, the minimum capacitance value is programmed using a stored multi-bit startup select signal or combination of select signals SEL0, SEL1, and SELN, provided by, for example, a non-volatile memory (not shown). The minimum capacitance value is provided for a predetermined amount of time and then a higher capacitance value is provided for normal operation by providing another combination of select signals. In the illustrated embodiment, the predetermined amount of time for holding the higher capacitance value is set in software. In other embodiments, the predetermined amount of time may be set another way, such as for example, a hardware counter.

The relatively high bias current is programmed by asserting control signal STARTUP in response to an asserted ENABLE signal. Also, after the predetermined amount of time, the startup control signal STARTUP is deasserted, causing bias current generator to provide a relatively lower bias current $I_{BIAS}$ for normal operation. The control signal STARTUP is provided by timer circuit 84 in response to receiving the ENABLE and CLK signals as discussed above. Therefore, the amount of bias current IBIAS for startup is controlled by hardware, unlike the amount of programmable capacitance which is controlled by software.

More specifically, in FIG. 1, P-channel transistor 26 of inverting amplifier 14 is biased separately than N-channel transistor 28. Transistor 28 is self-biased by feedback resistor 30. When an integrated circuit having oscillator circuit 10 is powered up, enable signal ENABLE is asserted and causes bias current generator 60 to provide a predetermined startup bias current $I_{BIAS}$. During startup, the predetermined startup bias current is relatively higher than a normal bias current for normal operation. As can be seen in FIG. 2, the STARTUP signal is asserted to couple transistor 76 to transistor 68, so that transistors 68 and 76 form a current mirror. The amount of current provided by transistor 76 is determined by the relative sizes of transistors 68 and 76 and the current through transistor 68. At the end of a predetermined time, timer circuit 84 deasserts signal STARTUP, transmission gate 82 decouples transistor 76 from transistor 68, and a normal bias current is provided by selected ones of transistors 78 and 80 as determined by which of select signals $I_{SEL0}$ and $I_{SELM}$ are asserted. In FIG. 2, only two normal current transistors are shown for illustration purposes. In other embodiments, there may be more or fewer normal current transistors to mirror with transistor 68.

Referring again to FIG. 1, a current through transistor 22 is mirrored by transistor 24 to supply a current to transistor 26. In the illustrated embodiment, the size ratio between transistors 22 and 24 is 1:20. Capacitor 31 functions as a low pass filter for the gate of transistor 26. Capacitor 35 is a coupling capacitor to provide a low impedance AC (alternating current) ground. The input oscillating signal $OSC_{IN}$ is coupled to the gate of transistor 26 via capacitor 33. Also, capacitor 33 functions to remove a DC (direct current) component from the $OSC_{IN}$ signal.

The application of a power supply voltage at $V_{DD}$ and bias current $I_{BIAS}$ will cause oscillator circuit 10 to start oscillating. To reduce the amount of time it takes to start oscillating, load capacitors 16 and 18 are set to a minimum capacitance value. As discussed above, the capacitance value is set by providing one or more of select signals SEL0, SEL1, and SELN. In the illustrated embodiment, the minimum capacitance value is 3 picoFarads. In another embodiment, the minimum capacitance value may be different.

Figure 3:
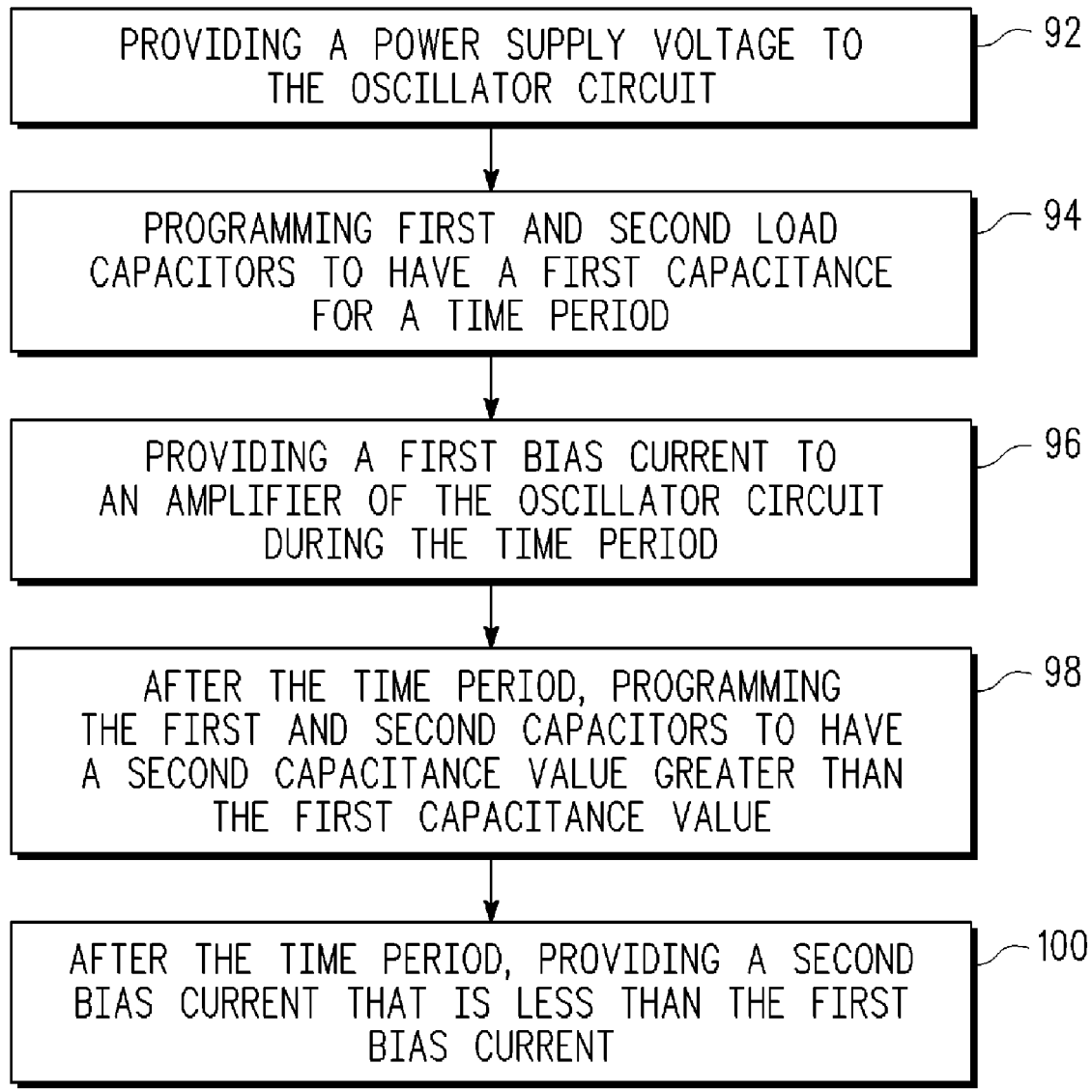
FIG. 3 illustrates a flow chart of a method for operating the crystal oscillator circuit of FIG. 1.

FIG. 3 illustrates a flow chart of a method 90 for operating the crystal oscillator circuit 10 of FIG. 1. In method 90 at step 92, a power supply voltage ($V_{DD}$) is provided to the oscillator circuit 10, where the oscillator circuit 10 includes first and second load capacitors 16 and 18, an amplifier 14, and a quartz crystal 20 connected together as illustrated in FIG. 1. At step 94, the first and second load capacitors are programmed to each have a first capacitance value for a predetermined time period. The predetermined time period is chosen to allow sufficient time for oscillator circuit 10 to start oscillating reliably at all process corners. The time period is shorter than would be required if normal load capacitance values were used. The first capacitance value is a minimum value and is lower than the normal capacitance value to allow oscillator circuit 10 to begin oscillating faster so that the integrated circuit consumes less power at startup. Note that in other embodiments, the first and second load capacitors could be programmed to each provide different capacitance values depending on the circuit configuration. At step 96, a first bias current ($I_{BIAS}$ in FIG. 1 and FIG. 2) is provided to the amplifier for the predetermined time period. The first bias current is greater than a normal bias current to further provide faster startup. At step 98 the first and second load capacitors 16 and 18 are each reprogrammed to have a second capacitance value at the end of the time period. Also, at step 100, the first bias current is replaced with a second bias current that is less than the first bias current at the end of the time period. The end of the time period marks the end of the startup period and normal operation continues with the second capacitance value and the second bias current for as long as the power supply voltage $V_{DD}$ is provided. The predetermined time period for the load capacitance during startup is set in software, while the predetermined time period for the bias current is set using hardware (timer 84). In other embodiments, the predetermined time period can be set a different way.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 1 and the discussion thereof describe an exemplary oscillator circuit, this exemplary oscillator circuit is presented merely to provide a useful reference in discussing various aspects of the invention. Of course, the description of the circuit has been simplified for purposes of discussion, and it is just one of many different types of appropriate circuits that may be used in accordance with the invention. Those skilled in the art will recognize that the boundaries between circuit blocks are merely illustrative and that alternative embodiments may merge circuits blocks or circuit elements or impose an alternate decomposition of functionality upon various circuit blocks or circuit elements.

Thus, it is to be understood that the circuits depicted herein are merely exemplary, and that in fact many other circuits can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of oscillator circuit 10 are circuitry located on a single integrated circuit or within a same device. Alternatively, circuit 10 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method of operating an oscillator circuit, the method comprising:
   providing a resonator, a first programmable load capacitor, a second programmable load capacitor, and an amplifier having an input and an output, wherein the first programmable load capacitor is coupled to the input, the second programmable load capacitor is coupled to the output, and the resonator is coupled between the input and the output;
   providing a timer for asserting a control signal for a predetermined time period in response to an enable signal;
   programming both the first and second programmable load capacitors to have a first capacitance value for a predetermined time period during startup of the oscillator circuit;
   providing a first bias current to the amplifier during the predetermined time period in response to the control signal being asserted;
   reprogramming the first and second programmable load capacitors to have a second capacitance value greater than the first capacitance value after the predetermined time period; and
   providing a second bias current to the amplifier after the predetermined time period in response to the control signal being deasserted, wherein the second bias current is less than the first bias current.

2. The method of claim 1, wherein:
   providing an amplifier comprises providing an amplifier comprising a transistor; and
   the transistor receives the first and second bias currents.

3. The method of claim 2, further comprising:
   providing a bias current generator for providing the first and second bias currents to the transistor, wherein the bias current generator comprises a timer, a plurality of transmission gates, and a plurality of bias transistors, wherein:
      each of the plurality of transmission gates is coupled to one of the plurality of bias transistors, and the timer is coupled to one of the plurality of transmission gates;
   providing each of the plurality of transmission gates with a first control voltage; and
   removing the first control voltage from the one of the plurality of transmission gates coupled to the timer when the timer sends a signal to the one of the plurality of transmission gates.

4. The method of claim 1, wherein:
   providing the first programmable load capacitor comprises providing a first plurality of switchable parallel capacitors; and
   providing the second programmable load capacitor comprises a providing a second plurality of switchable parallel capacitors.

5. The method of claim 3, further comprising:
   providing a current mirror coupled to the bias current generator and the resonator, wherein the current mirror alters the first and second bias currents from the bias current generator before the first and second bias currents are received by the amplifier.

6. The method of claim 1, wherein providing a resonator further comprises providing a quartz crystal.

7. The method of claim 2, wherein the transistor comprises a N-type metal oxide semiconductor (MOS) transistor having a gate coupled to a resistor and a drain coupled to the resistor.

8. A method of operating a crystal oscillator circuit, the method comprising:
   providing a crystal, a first load capacitor, an amplifier, and a bias current generator, wherein the crystal is coupled to the first load capacitor and the amplifier, and wherein the bias current generator provides a bias current for the amplifier, the bias current generator comprises a first transmission gate coupled to a first transistor and a second transmission gate coupled to a second transistor;
   programming the first load capacitor to have a first capacitance value during a first time period, wherein the crystal receives a first signal from the first load capacitor;
   providing the first transmission gate with a first control voltage and providing the second transmission gate with a second control voltage during the first time period to generate the bias current;
   altering the bias current by changing the second control voltage to a third control voltage following the first time period to begin a second time period; and
   increasing the first load capacitance value during the second time period, wherein the crystal receives a second signal from the first load capacitor during the second time period.

9. The method of claim 8, wherein changing the second control voltage to a third control voltage comprises lowering the second control voltage.

10. The method of claim 8, wherein increasing the first capacitance value during the second time period comprises programming the first load capacitor to have a second capacitance value during the second time period, wherein the second capacitance value is greater than the first capacitance value.

11. The method of claim 10, wherein the first capacitance value is approximately 3 picoFarads and the second capacitance value is approximately 19 picoFarads.

12. The method of claim 8, wherein providing the first load capacitor comprises a providing a plurality of switchable parallel capacitors.

13. The method of claim 8, further comprising providing a current mirror coupled to the bias current generator and the crystal, wherein the current mirror alters the bias current from the bias current generator before the bias current is received by the amplifier.

14. The method of claim 8, wherein the amplifier has a first input terminal for receiving the bias current, a second input terminal coupled to a plate electrode of the first load capacitor, and an output terminal coupled to a plate electrode of a second load capacitor.

15. The method of claim 14, wherein the amplifier comprises an N-type metal oxide semiconductor (MOS) transistor having a gate coupled to a resistor and a drain coupled to the resistor.

16. The method of claim 14, further comprising:
providing a second load capacitor coupled to the output terminal of the amplifier, wherein the second load capacitor comprises a plurality of switchable parallel capacitors;
programming the second load capacitor at the first capacitance value during the first time period; and
increasing the first load capacitance value during the second time period.

17. The method of claim 16, wherein increasing the first load capacitor value during the second time period comprises programming the second load capacitor at a second capacitance value during the second time period, wherein the second capacitance value is greater than the first capacitance value.

18. The method of claim 16, wherein:
providing the first load capacitor further comprises providing a first integrated load capacitor; and
providing the second load capacitor further comprises providing a second integrated load capacitor.

19. A method of operating an oscillator circuit, the method comprising:
providing a resonator having a first terminal and a second terminal, a first programmable capacitor coupled to the first terminal, a second programmable capacitor coupled to the second terminal, an amplifier having an input coupled to the first terminal and an output coupled to the second terminal, and a bias current generator for providing a bias current for the amplifier, wherein the bias current generator comprises:
a first transmission gate coupled to a first transistor; and
a second transmission gate coupled to a second transistor;
providing a power supply voltage to the oscillator;
programming the first programmable capacitor to have a first capacitance value during a startup time period;
programming the second programmable capacitor to have the first capacitance value during the startup time period;
providing the first transmission gate with a first control voltage;
providing the second transmission gate with a second control voltage, the first and second transistors for generating a bias current during the startup time period;
altering the bias current by changing the second control voltage to a third control voltage after the startup time period to begin normal operation of the oscillator circuit, wherein the third control voltage is less than the second control voltage; and
increasing the first and second capacitance values after the startup time period during the normal operation of the oscillator circuit.

* * * * *